United States Patent
Barber et al.

(10) Patent No.: US 8,514,033 B2
(45) Date of Patent: Aug. 20, 2013

(54) BAW STRUCTURE WITH REDUCED TOPOGRAPHIC STEPS AND RELATED METHOD

(75) Inventors: Bradley P. Barber, Acton, MA (US); Jeffrey A. Butler, Derry, NH (US); Craig E. Carpenter, Shirley, MA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 534 days.

(21) Appl. No.: 12/738,408

(22) PCT Filed: Sep. 12, 2008

(86) PCT No.: PCT/US2008/010679
§ 371 (c)(1),
(2), (4) Date: Apr. 16, 2010

(87) PCT Pub. No.: WO2009/051631
PCT Pub. Date: Apr. 23, 2009

(65) Prior Publication Data
US 2010/0231329 A1    Sep. 16, 2010

Related U.S. Application Data

(60) Provisional application No. 60/999,842, filed on Oct. 18, 2007.

(51) Int. Cl.
*H03H 9/15*    (2006.01)
*H03H 9/54*    (2006.01)
(52) U.S. Cl.
USPC .......................... 333/187; 333/189; 310/335

(58) Field of Classification Search
USPC ................ 333/133, 187–192; 310/322, 334, 310/335
See application file for complete search history.

(56) References Cited

U.S. PATENT DOCUMENTS

| | | | | |
|---|---|---|---|---|
| 6,496,085 B2* | 12/2002 | Ella et al. | | 333/189 |
| 6,509,813 B2* | 1/2003 | Ella et al. | | 333/187 |
| 6,812,619 B1* | 11/2004 | Kaitila et al. | | 310/320 |
| 6,924,717 B2 | 8/2005 | Ginsburg et al. | | |
| 6,985,052 B2* | 1/2006 | Tikka | | 333/189 |
| 6,998,940 B2* | 2/2006 | Metzger | | 333/187 |
| 7,170,215 B2* | 1/2007 | Namba et al. | | 310/324 |
| 7,466,213 B2* | 12/2008 | Lobl et al. | | 333/187 |

(Continued)

FOREIGN PATENT DOCUMENTS

| | | | |
|---|---|---|---|
| JP | 61-127217 | * | 6/1986 |
| JP | 06-060323 | | 3/1994 |
| JP | 2006-0254295 | | 9/2006 |
| WO | WO 2007/017974 A1 | | 2/2007 |

Primary Examiner — Barbara Summons

(57) ABSTRACT

According to one embodiment, a method of forming a segment of a layer of material, where the segment of the layer of material has at least one tapered sidewall, is disclosed, where the method includes forming a mask over the layer of material. The method includes etching the mask and the layer of material in an etch process by controlling an etch rate of the mask and an etch rate of the layer of material so as to form the segment of the layer of material with the at least one tapered sidewall. A first etch chemistry is used to etch the mask and a second etch chemistry is used to etch the layer of material. The etch rates of the mask and the layer of material can be controlled by controlling a ratio of the first and second etch chemistries. The method can be utilized to fabricate BAW structures.

9 Claims, 4 Drawing Sheets

(56) References Cited

U.S. PATENT DOCUMENTS

| | | | |
|---|---|---|---|
| 7,498,904 B2 * | 3/2009 | Ohara et al. | 333/189 |
| 2002/0084873 A1 | 7/2002 | Ella et al. | |
| 2003/0111439 A1 * | 6/2003 | Fetter et al. | 216/13 |
| 2007/0046157 A1 * | 3/2007 | Onishi et al. | 310/365 |

* cited by examiner

PRIOR ART

BAW STRUCTURE WITH REDUCED TOPOGRAPHIC STEPS AND RELATED METHOD

The present application is the National Stage of International Patent Application PCT/US2008/010679, filed on Sep. 11, 2008, which designated the United States and claims priority to a United States provisional patent application entitled "Step Discontinuity Reduction in Thin Film Devices," Ser. No. 60/999,842, filed on Oct. 18, 2007, the disclosures of which are hereby incorporated fully by reference into the present application.

BACKGROUND OF THE INVENTION

1. Field of the Invention

The present invention generally relates to the field of semiconductor fabrication. More particularly, the invention relates to the fabrication of thin films in semiconductor devices.

2. Background Art

Bulk acoustic wave (BAW) structures, which can be used in frequency control or filtering applications, can include a piezoelectric layer sandwiched between upper and lower electrodes and an underlying acoustic mirror structure. The acoustic mirror structure, which can include a number of alternating dielectric and metal segments, can be used to trap acoustic energy in the piezoelectric layer by reflecting acoustic energy. However, as a result of metal layer patterning by conventional etch processes, the sidewalls of the metal segments in the acoustic mirror structure and the lower electrode can cause abrupt steps in the topography of the later deposited piezoelectric layer. The abrupt topographic steps can cause vertical displacements in the grain structure of the piezoelectric layer, which, in turn, can cause undesirable voids to form in the grain structure. Also, it can be very difficult to deposit thin interconnect metal segments that are smooth and reliable over the aforementioned abrupt steps in the topography, thereby undesirably affecting device reliability.

In a conventional approach for reducing the abrupt steps in topography caused by the sidewalls of metals segments in the acoustic mirror structure and the lower electrode, the acoustic mirror structure can be formed in a trench in the substrate underlying the BAW structure, thereby providing a smoother topography for piezoelectric layer formation. In the conventional approach discussed above, the lower electrode can also be formed in the trench to further reduce the abrupt steps in the topography of the BAW structure. However, burying the acoustic mirror structure can require very controlled etch steps, which are difficult to perform, and can also require chemical mechanical polishing (CMP) for surface smoothing, which is an expensive and difficult to control manufacturing process. As a result, the aforementioned conventional approach can undesirably increase manufacturing cost.

SUMMARY OF THE INVENTION

A BAW structure with reduced topographic steps and related method, substantially as shown in and/or described in connection with at least one of the figures, as set forth more completely in the claims.

DETAILED DESCRIPTION OF THE INVENTION

The present invention is directed to a BAW structure with reduced topographic steps and related method. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
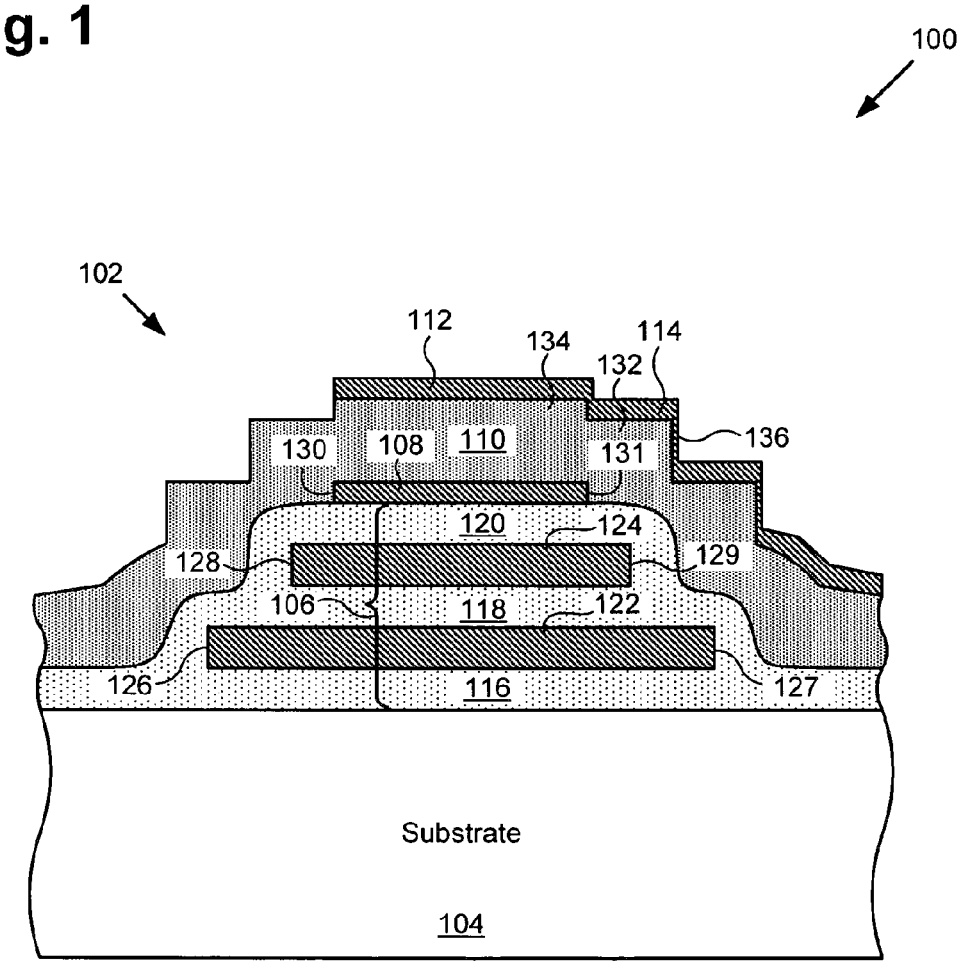
FIG. 1 illustrates a cross-sectional view of an exemplary structure including a conventional exemplary bulk acoustic wave structure.

FIG. 1 shows a cross-sectional view of a semiconductor die including a conventional exemplary BAW structure. Certain details and features have been left out of FIG. 1, which are apparent to a person of ordinary skill in the art. In FIG. 1, structure 100 includes conventional BAW structure 102 on substrate 104. Conventional BAW structure 102 includes acoustic mirror structure 106, lower electrode 108, piezoelectric layer 110, and upper electrode 112 which also serves as interconnect metal segment 114. Acoustic mirror structure 106 includes dielectric layers 116, 118, and 120 and metal segments 122 and 124 and provides acoustical isolation between conventional BAW structure 102 and substrate 104, which can be, for example, a silicon substrate. Conventional BAW structure 102, which can be a BAW resonator, can be used in a device, such as a BAW filter or as a resonator in a frequency control circuit, for example.

As shown in FIG. 1, dielectric layer 116 is situated over substrate 104, metal segment 122 is situated over dielectric layer 116, dielectric layer 118 is situated over metal segment 122, metal segment 124 is situated over dielectric layer 118, and dielectric layer 120 is situated over metal segment 124. Each of dielectric layers 116, 118, and 120 can comprise, for example, silicon oxide, and provides a low acoustic impedance, the product of material density and acoustic velocity of the material. Each of metal segments 122 and 124 can comprise a high density metal, such as tungsten (W), and provides a high acoustic impedance. It is often the case that metals are most desirable for use as the high impedance layer in the acoustic mirror since they usually provide higher density material than available dielectric materials. However, in order to make BAW devices with a plurality of individual resonators that are not capacitively coupled through parasitic paths through these underlying metal layers, the metal layers must be cut between individual resonators during the fabrication of the wafers. Dielectric layer 116 can be formed, for example, by depositing a layer of silicon oxide over substrate 104 by using a chemical vapor deposition (CVD) process or other suitable deposition process. Dielectric layers 118 and 120 can be formed, for example, by conformally depositing a layer of silicon oxide over respective metal segments 122 and 124 by using a CVD process or other suitable deposition process.

Metal segment 122 can be formed, for example, by depositing a layer of high density metal, such as tungsten, over dielectric layer 116 by using a physical vapor deposition (PVD) process or other suitable deposition process and appropriately patterning the high density metal layer by using a conventional plasma etch process. As a result of the conventional plasma etch process, metal segment 122 is formed with substantially vertical sidewalls 126 and 127, i.e., sidewalls 126 and 127 are substantially perpendicular to the top surface of substrate 104. Metal segment 124 can be formed in a similar manner as metal segment 122 and also has substantially vertical sidewalls (i.e. sidewalls 128 and 129).

Also shown in FIG. 1, lower electrode 108 is situated over dielectric layer 120 of acoustic mirror structure 106, piezoelectric layer 110 is situated over lower electrode 108 and acoustic mirror structure 106, and upper electrode 112 and interconnect metal segment 114 are situated over piezoelectric layer 110. Lower electrode 108, upper electrode 112, and interconnect metal segment 114 can comprise aluminum, platinum, molybdenum, tungsten, or other suitable metal, and/or combinations of suitable metals that result in reasonably low resistivity and sufficient material density, and piezoelectric layer 110 can comprise aluminum nitride, zinc oxide, or other suitable piezoelectric material. Lower electrode 108 can be formed, for example, by depositing a layer of metal, such as molybdenum, over acoustic mirror structure 108 by using a PVD process or other suitable deposition process and appropriately patterning the metal layer by using a conventional plasma etch process. As a result of the conventional plasma etch process, lower electrode 108 has substantially vertical sidewalls 130 and 131.

Piezoelectric layer 110 can be formed, for example, by depositing a layer of aluminum nitride over lower electrode 108 and acoustic mirror structure 106 by using a PVD process or other suitable deposition process. Piezoelectric layer 110 has a highly oriented grain structure over lower electrode 108. However, vertical displacements can occur in the grain structure of portions of piezoelectric layer 110 that overlie abrupt steps in underlying topography that are caused by the substantially vertical sidewalls of lower electrode 108 and metal segments 122 and 124. For example, portion 132 of piezoelectric layer 110 is vertically displaced with respect to portion 134 of piezoelectric layer 110 as a result of the abrupt step in topography caused by sidewall 131 of lower electrode 108. If severe enough, vertical displacements can cause undesirable void formation in the grain structure of the piezoelectric layer.

Upper electrode 112 and interconnect metal segment 114 can be formed, for example, by depositing a layer of metal, such as molybdenum, over piezoelectric layer 110 by using a PVD process or other suitable deposition process and appropriately patterning the metal layer. Portions of interconnect metal segment 114 that are situated at steps in piezoelectric layer 110 caused by abrupt changes in the underlying topography can be significantly reduced in thickness. This can be a result that deposited layer 110 may deposit with a thinner cross section in a voided region resembling a shallow trench or notch, or layer 110 may be missing altogether if the void in the underlying layer is extreme and resembles a reentrant overhang or cliff such that sputtered material can not deposit in recessed regions as a result of a shadowing effect of the overhang during line of site PVD deposition. As a result, subsequent processing of BAW structure 102 can cause portions of interconnect metal segment 114 that have reduced thickness, such as portion 136, to form an open circuit or be at higher risk to fail in higher power RF applications. Thus, the abrupt steps in topography caused by the substantially vertical sidewalls of metal segments 122 and 124 and lower electrode 108 can undesirably affect the reliability of the conventional BAW structure.

Figure 2:
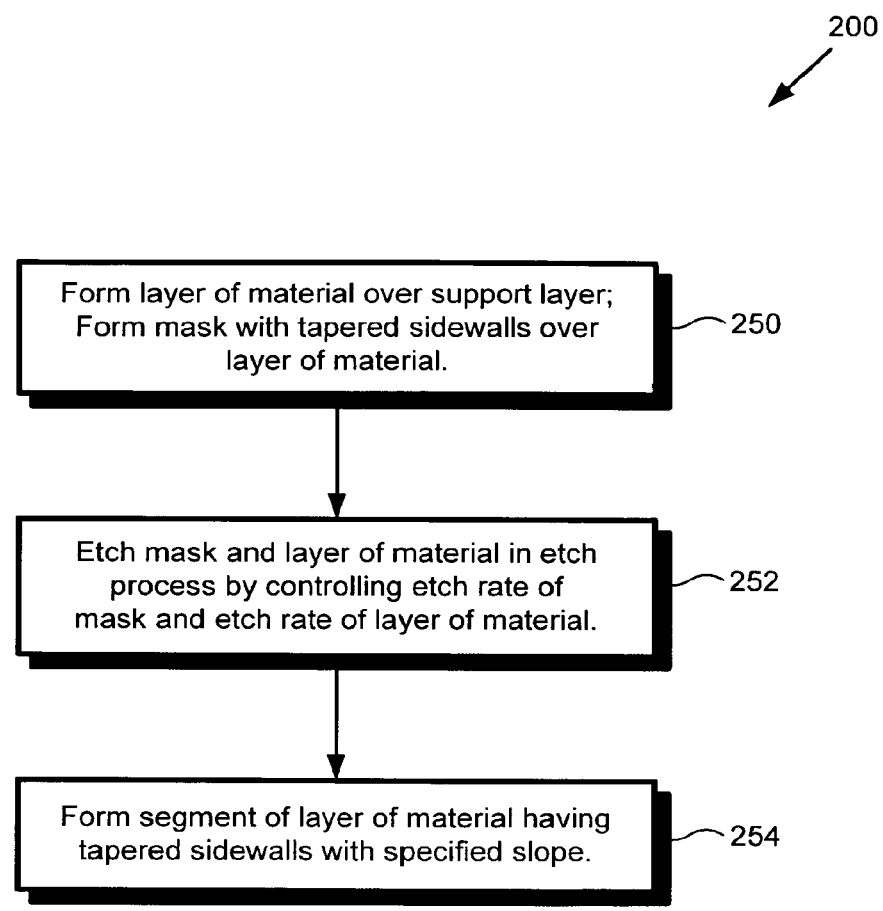
FIG. 2 shows a flowchart illustrating the steps taken to implement an embodiment of the present invention.

FIG. 2 shows a flow chart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art. Steps 250 through 254 indicated in flowchart 200 are sufficient to describe one embodiment of the present invention; however, other embodiments of the invention may utilize steps different from those shown in flowchart 200. It is noted that the processing steps shown in flowchart 200 are performed on a portion of a processed wafer, which, prior to step 250, includes, among other things, a support layer and a substrate (not shown in any of the figures). The processed wafer may also be referred to simply as a wafer or a semiconductor die or simply a die in the present application.

Figure 3A:
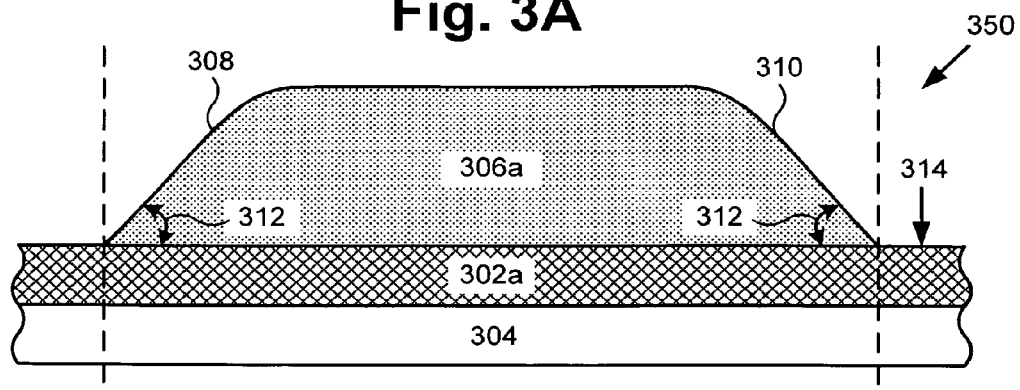
FIG. 3A illustrates a cross-sectional view, which includes a portion of a wafer processed according to an embodiment of the invention, corresponding to an initial step in the flowchart in FIG. 2.

Referring now to step 250 in FIG. 2 and structure 350 in FIG. 3A, at step 250 of flowchart 200, layer 302a is formed over support layer 304 and mask 306a, which has sidewalls 308 and 310, is formed over layer 302a. Support layer 304 can be situated over a substrate (not shown in FIG. 3A) and can comprise, for example, silicon oxide or other dielectric material in one embodiment. In other embodiments, support layer 304 can comprise a conductive material, such as a metal, or a semiconductor material. As shown in FIG. 3A, layer 302a is situated over support layer 304 and mask 306a is situated over layer 302a. In one embodiment, wherein support layer 304 is not utilized, layer 302a can be situated directly over a substrate, such as a silicon substrate. In one embodiment of the invention, layer 302a can comprise a conductive material, such as a metal or metal stack. In other embodiments, layer 302a can comprise a dielectric material or a semiconductor material. In one embodiment, layer 302a can have a thickness of between 0.5 microns and 1.0 microns. In another embodiment, layer 302a can have a thickness of between 0.2 microns and 0.5 microns.

Sidewalls 308 and 310 form angle 312 with respect to top surface 314 of layer 302a, which determines an "initial slope" of sidewalls 308 and 310. The "initial slope" of sidewalls 308 and 310 refers to the slope of sidewalls 308 and 310 before the mask is etched in a subsequent etch process. In one embodiment of the invention, angle 312 can be approximately 45.0 degrees. In other embodiments, angle 312 can be less than or greater than 45.0 degrees. In one embodiment, sidewalls 308 and 310 are not tapered. In such embodiment, sidewalls 308 and 310 can be substantially vertical, i.e., substantially perpendicular to top surface 314 of layer 302a.

Mask 306a can comprise resist or other type of masking material and can have a thickness of 3.0 microns±20.0 nanometers (nm) in an embodiment. In one embodiment, mask 306a can comprise photoresist. Angles 312 of sidewalls 308 and 310 of mask 306a can be adjusted by controlling the mask formation process, such as a photolithographic process. In one embodiment, mask 306a can be formed by depositing a layer of resist, such as photoresist, over layer 302a and patterning the layer of resist with a light exposure in a positive resist process. The exposed layer of resist can then be processed in a developer solution to remove unwanted portions of the resist. A remaining portion of resist can then be subjected to a bake process, which can be controlled to allow the sidewalls of the resist to melt and flow so as to create smooth, tapered sidewalls having a desired initial slope. In one embodiment, the bake process can be controlled to cause sidewalls 308 and 310 of mask 306a to be substantially vertical. The result of step 250 of flowchart 200 is illustrated by structure 350 in FIG. 3A.

Figure 3B:
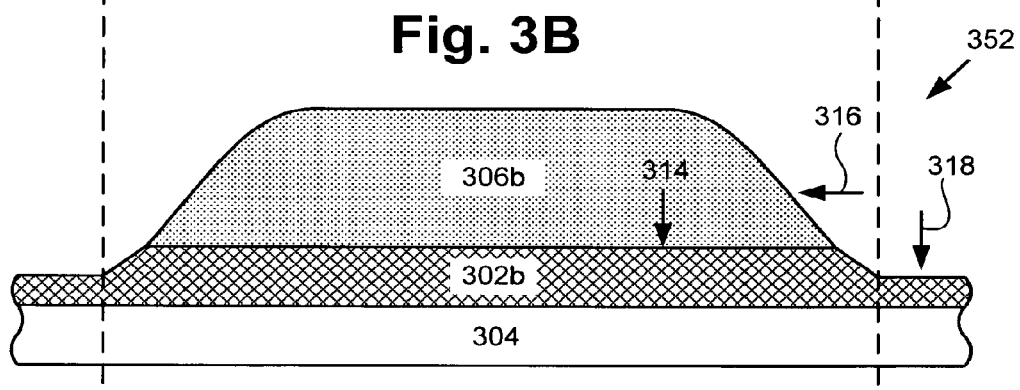
FIG. 3B illustrates a cross-sectional view, which includes a portion of a wafer processed according to an embodiment of the invention, corresponding to an intermediate step in the flowchart in FIG. 2.

Referring to step 252 in FIG. 2 and structure 352 in FIG. 3B, at step 252 of flowchart 200, mask 306a (shown in FIG. 3A) and layer 302a (shown in FIG. 3A) are etched in an etch process where one controls the relative etch rates of mask 306a and layer 302a. In FIG. 3B, mask 306b corresponds to mask 306a in FIG. 3A after mask 306a has been partially etched in the etch process and layer 302b corresponds to layer 302a in FIG. 3A after layer 302a has been partially etched in the same etch process. In an embodiment of the invention, the rate at which mask 306b is etched or eroded in the etch process, such as a plasma etch process, can be controlled with respect to the rate at which layer 302b is etched so as to achieve a patterned segment (i.e. segment 320 in FIG. 3C) having tapered sidewalls with a specified slope. For example, a patterned segment of layer 302b having tapered sidewalls with a specified slope can be provided by balancing the etch rate of mask 306b in a lateral direction (as indicated by arrow 316) with the etch rate of layer 302b in a vertical direction (as indicated by arrow 318) in the etch process. In one embodiment, the ratio of the etch rate of mask 306b to the etch rate of layer 302b can be, for example, between 3:1 and 6:1.

In an embodiment of the invention's etch process, such as a plasma etch process, an etch chemistry can be selected to etch mask 306b and another etch chemistry can be selected to etch layer 302b. The specific etch chemistries that are utilized to etch the mask 306b and layer 302b depend on the respective compositions of the mask and the layer to be etched. For example, in an embodiment of the invention in which mask 302b comprises photoresist, the mask can be etched by using an etch chemistry comprising oxygen ($O_2$). Thus, to etch a masking material comprising photoresist, a selected amount of oxygen can be inputted into an etch chamber, such as a plasma etch chamber, and blended with the particular etch chemistry that is utilized to etch layer 302b. In an embodiment in which layer 302b comprises a metal such as tungsten or molybdenum, the layer can be etched by, for example, a fluorine-based etch chemistry, such as sulfur hexafluoride ($SF_6$). In one embodiment, the ratio of oxygen to a fluorine-based etch chemistry, such as $SF_6$, in a plasma etch process can be from 1:2 to 1:1. In an embodiment in which layer 302b comprises aluminum, the layer can be etched by using a chlorine-based etch chemistry, such as chlorine ($Cl_2$) or boron trichloride ($BCl_3$) and again oxygen can be also introduced during the etch to give desire relative rates of etch of the photoresist and the aluminum.

The etch rates of mask 306b and layer 302b can be controlled by balancing the respective etch chemistries that are used to etch the mask and the layer of material in the etch process. In one embodiment, a patterned segment of layer 302b having tapered sidewalls with a slope of approximately 45.0 degrees can be achieved by controlling the respective etch chemistries that are used to etch mask 306b and layer 302b in the etch process so as to cause the etch rate of layer 302b in the vertical direction to be approximately equal to the etch rate of mask 306b in the lateral direction. As a result of the etch process, the size of mask 306b is reduced in both height and width compared to mask 306a. The result of step 252 of flowchart 200 is illustrated by structure 352 in FIG. 3B.

Figure 3C:
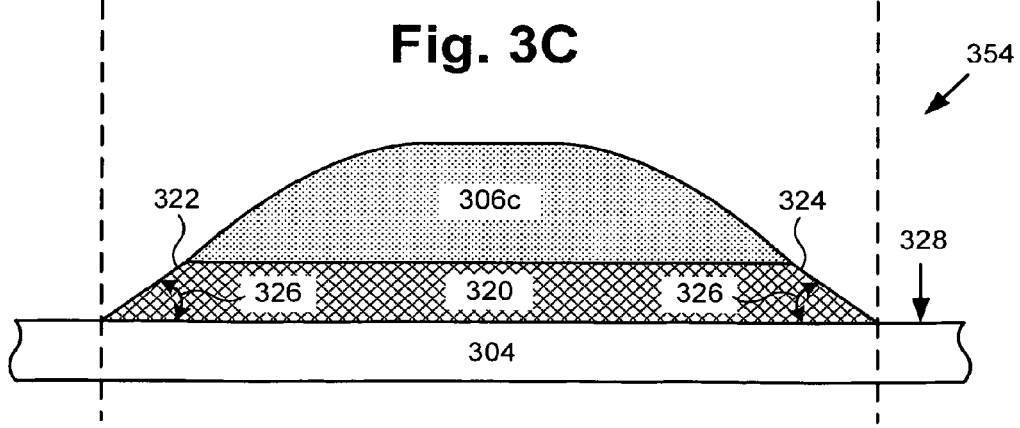
FIG. 3C illustrates a cross-sectional view, which includes a portion of a wafer processed according to an embodiment of the invention, corresponding to a final step in the flowchart in FIG. 2.

Referring to step 254 in FIG. 2 and structure 354 in FIG. 3C, at step 254 of flowchart 200, segment 320 of layer 302b is formed having tapered sidewalls 322 and 324, which have a specified slope. As shown in FIG. 3C, segment 320 is situated over support layer 304 and mask 306c is situated over segment 320. Mask 306c is the portion of mask 306b (shown in FIG. 3B) that remains after the mask has been etched in the etch process at step 252 of flowchart 200. Also shown in FIG. 3C, the slope of tapered sidewalls 322 and 324 corresponds to angle 326, which is the angle formed between sidewalls 322 and 324 and top surface 328 of support layer 304. It should be noted that as a result of the choice of etch chemistry and resulting etch rates of mask material and material comprising layer 302a of FIG. 3A, angles 326 of FIG. 3C may not end up being the same as angles 312 of FIG. 3A.

As discussed above, the slope of tapered sidewalls 322 and 324 of segment 320 can be controlled by controlling the etch rate of mask 306b in a lateral direction and the etch rate of layer 302b in a vertical direction. The etch rate of mask 306b in the lateral direction can be controlled, for example, by controlling the etch chemistry that is used to etch the mask and/or by controlling the initial slope of sidewalls 308 and 310 of mask 306a (shown in FIG. 3A). In an embodiment in which oxygen is used to etch the mask and a fluorine-based etch chemistry is used to etch the layer of material, the slope of sidewalls 322 and 324 can be controlled by varying the concentrations of oxygen and the fluorine-based etch chemistry in a plasma etch process. Mask 306c, i.e., the remaining portion of mask material, can be removed from segment 320 in an etch process as known in the art before subsequent processing. The result of step 254 of flowchart 200 is illustrated by structure 354 in FIG. 3C.

Figure 4:
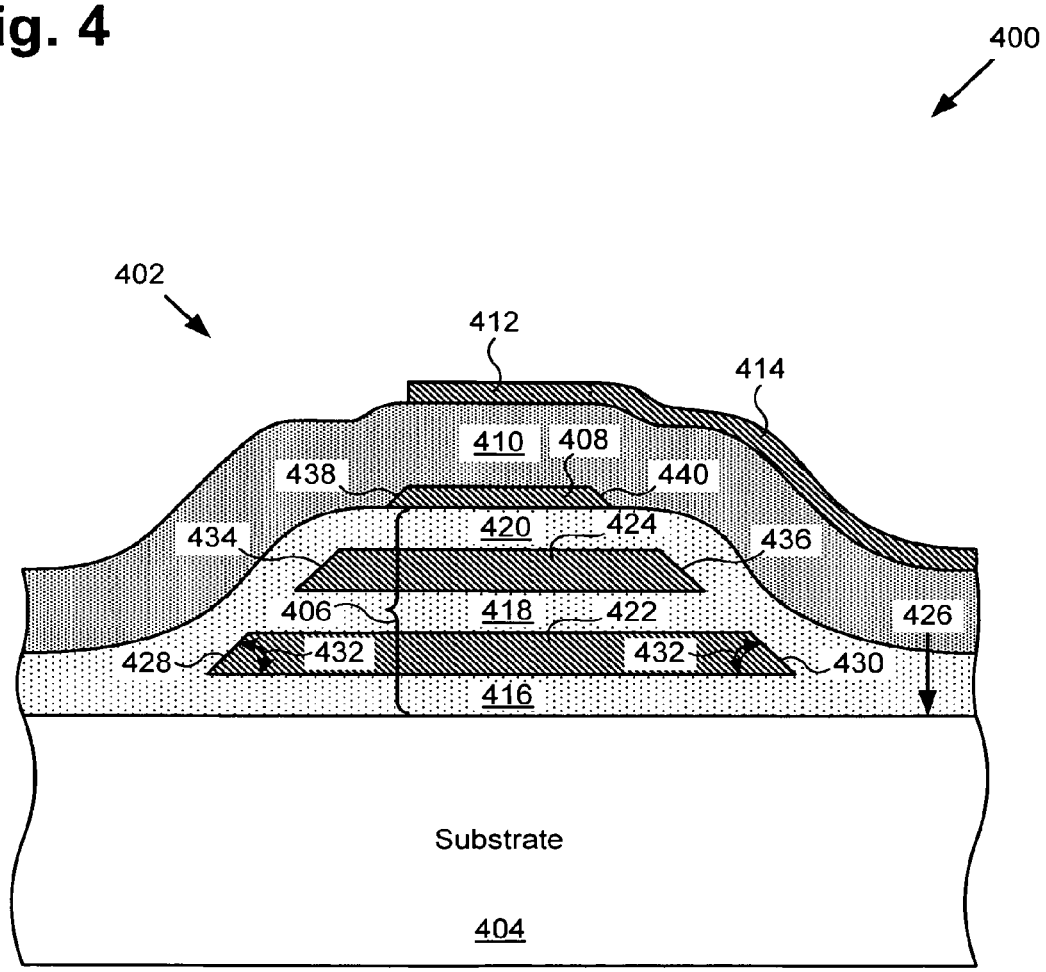
FIG. 4 illustrates a cross-sectional view of an exemplary structure including an exemplary bulk acoustic wave structure in accordance with one embodiment of the present invention.

FIG. 4 shows a cross-sectional view of a semiconductor die including an exemplary BAW structure in accordance with one embodiment of the present invention. Certain details and features have been left out of FIG. 4, which are apparent to a person of ordinary skill in the art. In FIG. 4, structure 400 includes BAW structure 402 on substrate 404. Baw structure 402 includes acoustic mirror structure 406, lower electrode 408, piezoelectric layer 410, and upper electrode 412, which is connected to interconnect metal segment 414. Acoustic mirror structure 406 includes dielectric layers 416, 418, and 420 and metal segments 422 and 424 and provides acoustical isolation between BAW structure 402 and substrate 404, which can comprise, for example, silicon. BAW structure 402, which can be a BAW resonator, can be used in a device, such as a BAW filter or BAW RF filter, or as a resonator in a frequency control circuit, for example.

As shown in FIG. 4, dielectric layer 416 is situated over substrate 404, metal segment 422 is situated over dielectric layer 416, dielectric layer 418 is situated over metal segment 422, metal segment 424 is situated over dielectric layer 418, and dielectric layer 420 is situated over metal segment 424. Each of dielectric layers 416, 418, and 420 can comprise silicon oxide or other dielectric material and can provide a low acoustic impedance. In one embodiment of the invention, dielectric layers 416, 418, and 420 can each have a thickness of between 0.5 microns and 1.0 microns. Each of metal segments 122 and 124 can comprise a high density metal, such as tungsten or molybdenum. In one embodiment, each of metal segments 122 and 124 can comprise titanium tungsten (TiW).

In an embodiment, metal segments 122 and 124 can each have a thickness of between 0.5 microns and 1.0 microns.

Dielectric layer 416 can be formed, for example, by depositing a layer of layer of dielectric material, such as silicon oxide, over substrate 404 by using a CVD process or other suitable deposition process. Metal segment 422 can be formed, for example, by depositing a layer of metal, such as tungsten or molybdenum, over dielectric layer 416 by using a PVD process or other suitable deposition process. A mask, such as mask 306a in FIG. 3A, can then be formed on the layer of metal such that the mask has tapered sidewalls, as discussed at step 250 of flowchart 200 in FIG. 2. In one embodiment, the mask can comprise photoresist. In one embodiment, the sidewalls of the mask can have an initial slope of approximately 45.0 degrees with respect to top surface 426 of substrate 404. After the mask has been formed, the mask and the metal layer can be etched in an etch process, such as a plasma etch process, as discussed at step 252 of flowchart 200 in FIG. 2. In an embodiment of the invention in which the mask comprises photoresist and the high density metal layer comprises tungsten or titanium tungsten, the mask can be etched in a plasma etch process by using an etch chemistry comprising oxygen and the high density metal layer can be etched in a fluorine-based etch chemistry, which can comprise, for example, $SF_6$.

By balancing the etch rate of the mask in a lateral direction (i.e. a direction parallel to top surface 426 of substrate 404) and the etch rate of the metal layer in a vertical direction (i.e. a direction perpendicular to top surface 426 of substrate 404), metal segment 422 can be formed having tapered sidewalls (i.e. sidewalls 428 and 430), which form angle 432 with respect to top surface 426 of substrate 404. In one embodiment, angle 432 can be approximately equal to 45.0 degrees. Thus, the slope of sidewalls 428 and 430 can be determined by appropriately controlling the etch rate of the mask in the lateral direction and the etch rate of the metal layer in the vertical direction.

The etch rate of the mask in the lateral direction and the etch rate of the metal layer in the vertical direction can be controlled by controlling the ratio of the etch chemistry utilized to etch the mask to the etch chemistry utilized to etch the metal layer. In one embodiment, the ratio of the etch chemistry utilized to etch the mask to the etch chemistry utilized to etch the metal layer can be controlled to cause the etch rate of the mask in the lateral direction to be approximately equal to the etch rate of the metal layer in the vertical direction. The etch rate of the mask in the lateral direction can also be controlled by adjusting the initial slope of the sidewalls of mask. For example, the etch rate of the mask in the lateral direction can be increased by decreasing the slope of the mask's sidewalls. After the tapering etch is performed, the masking material by its construction can be completely removed with little or no effect on the sublayer before subsequent layers are deposited.

Dielectric layer 418 can be formed by, for example, conformally depositing a layer of dielectric material, such as silicon oxide, over metal segment 422 by using a CVD process or other suitable deposition process. By tapering sidewalls 428 and 430 of metal segment 422, an embodiment of the invention provides a significantly smoother topography over sidewalls 428 and 430 in BAW structure 402 compared to a topography formed over substantially vertical sidewalls, such as sidewalls 126 and 127 of metal segment 122 in conventional BAW structure 102. Metal segment 424 can be formed over dielectric layer 418 in a similar manner as metal segment 422 discussed above so as to cause sidewalls 434 and 436 of metal segment 424 to have a specified slope. In one embodiment, the slope of sidewalls 434 and 436 of metal segment 424 can be approximately equal to the slope of sidewalls 428 and 430 of metal segment 422. Dielectric segment 420 can be formed by, for example, conformally depositing a layer of dielectric material, such as silicon oxide, over metal segment 422 by using a CVD process or other suitable deposition process. By tapering sidewalls 434 and 436 of metal segment 424, an embodiment of the invention provides a significantly smoother topography over sidewalls 434 and 436 in BAW structure 402 compared to a topography formed over substantially vertical sidewalls, such as sidewalls 128 and 129 of metal segment 124 in conventional BAW structure 102.

Also shown in FIG. 4, lower electrode 408 is situated over dielectric layer 420 of acoustic mirror structure 406, piezoelectric layer 410 is situated over lower electrode 408 and acoustic mirror structure 406, and upper electrode 412 and interconnect metal segment 414 are situated over piezoelectric layer 410. Lower electrode 408, upper electrode 412, and interconnect metal segment 414 can comprise molybdenum, tungsten, or other suitable high density metal. In one embodiment, lower electrode 408, upper electrode 412, and interconnect metal segment 414 can have a thickness of between 0.2 microns and 0.5 microns. Lower electrode 408 can be formed over dielectric layer 420 in a similar manner as metal segment 422 discussed above so as to cause sidewalls 438 and 440 of lower electrode 408 to have a specified slope. In one embodiment, sidewalls 438 and 440 of lower electrode 408 can have a slope equal to approximately 45.0 degrees. In one embodiment, sidewalls 438 and 440 of lower electrode 408, sidewalls 434 and 436 of metal segment 424, and sidewalls 428 and 430 of metal segment 422 can have approximately equal slopes. It should be noted that even the construction of BAW devices not requiring an acoustic mirror, such as film bulk acoustic resonators (FBAR), can still require a counter-electrode with its corresponding discontinuity at its boundary that can be tapered in this process.

Piezoelectric layer 410 can comprise aluminum nitride, zinc oxide, or other suitable piezoelectric material. In one embodiment, piezoelectric layer 410 can have a thickness of between 0.75 microns and 1.5 microns. Piezoelectric layer 410 can be formed, for example, by depositing a layer of piezoelectric material such as aluminum nitride over lower electrode 408 and acoustic mirror structure 406 by using a PVD process or other suitable deposition process. Piezoelectric layer 410 has a highly oriented grain structure over lower electrode 408 and also has a grain structure that is also oriented in the portion of piezoelectric layer 410 that extends away from sidewalls 438 and 440 of lower electrode 408 in a lateral direction. However, since the sidewalls of metal segments 422 and 424 and lower electrode 408 are tapered, abrupt steps in topography over the sidewalls are avoided. As a result, piezoelectric layer 410 does not have undesirable vertical displacements in grain structure, as in piezoelectric layer 110 in conventional BAW structure 102 in FIG. 1, which can cause a discontinuity and in extreme cases voids or reentrant steps in the piezoelectric layer.

Upper electrode 412 and interconnect metal segment 414 can be formed, for example, by depositing a layer of dense metal, such as molybdenum or tungsten, over piezoelectric layer 410 by using a PVD process or other suitable deposition process and appropriately patterning the dense metal layer. Since abrupt steps in underlying topography are avoided by providing tapered sidewalls for metal segments 422 and 424 and lower electrode 408, an embodiment of the invention provides a significantly smoother topography under interconnect metal segment 414 compared to the abrupt steps in topography caused by the substantially vertical sidewalls of the metal segments and lower electrode in conventional BAW structure 102. By providing a significantly smoother underlying topography, an embodiment of the invention enables an interconnect metal segment to be formed having a significantly reduced resistance and an increased reliability compared to an interconnect metal segment formed over abrupt step discontinuities caused by substantially vertical sidewalls of underlying metal segments and lower electrode in a conventional BAW structure. As a result, an embodiment of the invention provides a BAW structure having increased reliability compared to a conventional BAW structure.

Thus, as discussed above, an embodiment of the invention in FIGS. 2, 3A, 3B, and 3C provides a method for forming a segment of material having tapered sidewalls with a specified slope by controlling an etch rate of a mask used to form the segment of material and the etch rate of the layer from which the segment of material is formed. In an embodiment of the invention in FIG. 4, a BAW structure is formed having metal segments and a lower electrode with tapered sidewalls to advantageously reduce abrupt variations in topography underlying a piezoelectric layer. As a result, an embodiment of the invention can provide a more reliable and effective interconnect metal segment for connecting to an upper electrode of the BAW structure, which advantageously increases the reliability of the BAW structure.

From the above description of embodiments of the present invention it is manifest that various techniques can be used for implementing the concepts of the present invention without departing from its scope. Moreover, while the present embodiments of the invention have been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A bulk acoustic wave (BAW) structure comprising:
a lower electrode situated over a substrate, said lower electrode having at least one tapered sidewall;
a piezoelectric layer situated over said lower electrode;
an upper electrode situated over said piezoelectric layer; and
an acoustic mirror situated between said lower electrode and said substrate, said acoustic mirror comprising a plurality of metal segments,
wherein each of said plurality of metal segments has at least one tapered sidewall, and wherein each tapered sidewall of said plurality of metal segments has a slope substantially equal to a slope of said at least one tapered sidewall of said lower electrode.

2. The BAW structure of claim 1, wherein each of said plurality of metal segments has tapered sidewalls.

3. The BAW structure of claim 1, wherein each of the plurality of metal segments has a thickness between approximately 0.5 micron and approximately 1.0 micron.

4. The BAW structure of claim 3, wherein each of the lower electrode and the upper electrode has a thickness between approximately 0.2 micron and approximately 0.5 micron.

5. The BAW structure of claim 4, wherein the acoustic mirror further comprises a plurality of dielectric layers separating the plurality of metal segments.

6. The BAW structure of claim 5, wherein each of the plurality of dielectric layers has a thickness between approximately 0.5 micron and approximately 1.0 micron.

7. The BAW structure of claim 1, wherein the slope of each tapered sidewall of said plurality of metal segments and the slope of said at least one tapered sidewall of said lower electrode is approximately 45 degrees.

8. A bulk acoustic wave (BAW) structure comprising:
a lower electrode formed over a substrate, the lower electrode having at least one tapered sidewall;
a piezoelectric layer formed over the lower electrode;
an upper electrode formed over the piezoelectric layer; and
an acoustic mirror formed between the lower electrode and the substrate, the acoustic mirror comprising a plurality of metal segments, at least one of the plurality of metal segments having tapered sidewalls,
wherein each of the tapered sidewalls of the at least one of the plurality of metal segments has a slope angle of approximately 45 degrees.

9. The BAW structure of claim 8, wherein the at least one tapered sidewall of the lower electrode has a slope angle of approximately 45 degrees.

* * * * *